United States Patent
Yu et al.

(10) Patent No.: US 7,872,701 B2
(45) Date of Patent: Jan. 18, 2011

(54) METHOD FOR FIXING FPC OF DISPLAY

(75) Inventors: Chuan-Pei Yu, I-Lan Hsien (TW); Chung-Liang Hsiao, Chi-Lung (TW)

(73) Assignees: Innocom Technology (Shenzhen) Co., Ltd., Shenzhen, Guangdong Province (CN); Chimei Innolux Corporation, Miao-Li County (TW)

( * ) Notice: Subject to any disclaimer, the term of this patent is extended or adjusted under 35 U.S.C. 154(b) by 818 days.

(21) Appl. No.: 11/275,291

(22) Filed: Dec. 21, 2005

(65) Prior Publication Data
US 2007/0013824 A1    Jan. 18, 2007

(30) Foreign Application Priority Data
Jul. 15, 2005    (TW) ................ 94124208 A

(51) Int. Cl.
*G02F 1/1333*    (2006.01)
(52) U.S. Cl. .................. 349/58; 349/150; 349/187
(58) Field of Classification Search .......... 349/158, 349/150, 58
See application file for complete search history.

(56) References Cited

U.S. PATENT DOCUMENTS

| | | | |
|---|---|---|---|
| 6,677,664 B2* | 1/2004 | Inoue et al. | 257/668 |
| 6,847,415 B1* | 1/2005 | Yoshimura et al. | 349/58 |
| 6,885,411 B2* | 4/2005 | Ogawa et al. | 349/58 |
| 7,453,528 B2* | 11/2008 | Kim et al. | 349/1 |
| 2002/0097353 A1* | 7/2002 | Lee | 349/58 |
| 2003/0117543 A1 | 6/2003 | Chang | |
| 2003/0169383 A1* | 9/2003 | Kim | 349/58 |
| 2004/0239828 A1* | 12/2004 | Cho | 349/58 |
| 2005/0259387 A1* | 11/2005 | Sung et al. | 361/681 |
| 2006/0152664 A1* | 7/2006 | Nishio et al. | 349/150 |

FOREIGN PATENT DOCUMENTS

TW    494586 B    7/2002
TW    1231740 B    4/2005

* cited by examiner

*Primary Examiner*—David Nelms
*Assistant Examiner*—Thanh-Nhan P Nguyen
(74) *Attorney, Agent, or Firm*—Wei Te Chung

(57) ABSTRACT

A method for fixing a flexible circuit board (FPC) of a display module includes providing a housing having at least a fixing pin, providing a display panel and an FPC having at least a fixing hole corresponding to the fixing pin, disposing the display panel and the FPC on the housing and folding back the FPC on another side of the housing such that the fixing pin passes through the fixing hole, and performing a hot mounting process to the fixing pin to enlarge the top end of the fixing pin to press the FPC onto the housing.

9 Claims, 12 Drawing Sheets

METHOD FOR FIXING FPC OF DISPLAY

BACKGROUND OF THE INVENTION

1. Field of the Invention

The invention relates to a method for fixing a flexible printed circuit (FPC) of a display. More particularly, the invention relates to a method for fixing a FPC of a display through a housing.

2. Description of the Prior Art

Liquid crystal display modules are widely applied to information products such as personal desktop computers, notebook computers, personal digital assistants (PDA), mobile phones, etc. due to the characteristics of light weight, low power consumption, small size, and little radiation pollution. Liquid crystal display modules are even poised to replace the CRT monitor and the conventional TV.

In order to satisfy the market for lightweight and small electronic products, manufacturers should continuously develop various component placements within the limited space of products. Usually, a liquid crystal display panel is connected to an external device by a flexible printed circuit (FPC) in order to control the general appearance of the panel. Because the FPC is flexible, the FPC is usually folded back according to the placement of the display module in order to save more space.

Please refer to FIG. 1 and FIG. 2. FIG. 1 is a schematic front view of a prior art flat display module 10, and FIG. 2 is a schematic back view of the prior art flat display module 10 of FIG. 1. The prior art flat display module 10 comprises a housing 12, a flat display panel 14 positioned in the containing space of the housing 12, and an FPC 16 connected to the flat display panel 14. In addition, the backlight module comprises a reflector 18 positioned on the bottom thereof. The rectangular reflector 18 is seen in the housing 12 in the back view of the flat display module 10. As shown in FIG. 2, in order to save more space of the flat display module 10, the FPC 16 is folded back on the back of the flat display module 10. For the purpose of fixing the FPC 16, fixing glue is positioned between the reflector 18 and the FPC 16 so that the FPC 16 adheres to the back of the flat display module 10. A common adhered position of the fixing glue is shown as a dotted-line circle in FIG. 2. However, while the fixing glue adheres to the reflector 18, the FPC 16 pulls at the reflector 18 due to the strain of the FPC 16, and results in a mura on the flat display panel 14. On the other hand, because the folded-back FPC 16 pulls the fixing glue back, the reflector 18 becomes warped after a period, and the FPC 16 may not closely adhere to the back of the flat display module 10 any more. Thus, the display performance of the flat display panel 14 is influenced.

In order to solve the above-mentioned problem, one of the possible solutions is to reduce the size of the reflector 18 so that the fixing glue can adhere to the place around the reflector 18 to fix the FPC 16. Please refer to FIG. 3. FIG. 3 is a schematic back view of a prior art flat display module 10. As shown in FIG. 3, the lower part of the reflector 18 is narrower than the upper part of the reflector 18 so that the fixing glue 20 can adhere to the housing 12 or other rigid structure. Thus, the FPC 16 adheres to the back of the flat display module 10 without a warped reflector 18 or influence on the display images. However, changing the shape of the reflector 18 may cause some problems. One problem is light leakage from the back of the backlight module resulting from the narrower part of the reflector 18. Another problem is the difficulty of the adhering process due to the narrow space for the fixing glue 20. If the fixing glue 20 is carelessly applied to the surface of the reflector 18, the reflector 18 can still become warped. Still another problem is poor adhesion to fix the FPC 16 resulting from the narrow space for the fixing glue 20.

On the other hand, in some flat display module designs, fixing glue having electric conductivity is used as adhesive to fix the FPC. Such glue might be metallic glue, for example. Usually, the adhesion of this type of fixing glue is too poor to fix the FPC, and the poor adhesion causes some problems such as peeling.

SUMMARY OF THE INVENTION

It is therefore a primary object of the claimed invention to provide a method for fixing an FPC of a display module, wherein the FPC is fixed efficiently onto the housing of the flat display module in a limited space to overcome the aforementioned problems.

According to the claimed invention, a method for fixing an FPC of a display comprises providing a housing having at least a fixing pin, providing a display panel and an FPC having at least a fixing hole corresponding to the fixing pin, disposing the display panel and the FPC on the housing and folding back the FPC on another side of the housing such that the fixing pin passes through the fixing hole, and performing a hot mounting process to the fixing pin to enlarge the top end of the fixing pin to press the FPC onto the housing.

Because the method of this present invention changes the shape of the fixing pin by a hot mounting process in order to fix the FPC, this simple process can fix the FPC efficiently without changing a size of a reflector or applying any fixing glue.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
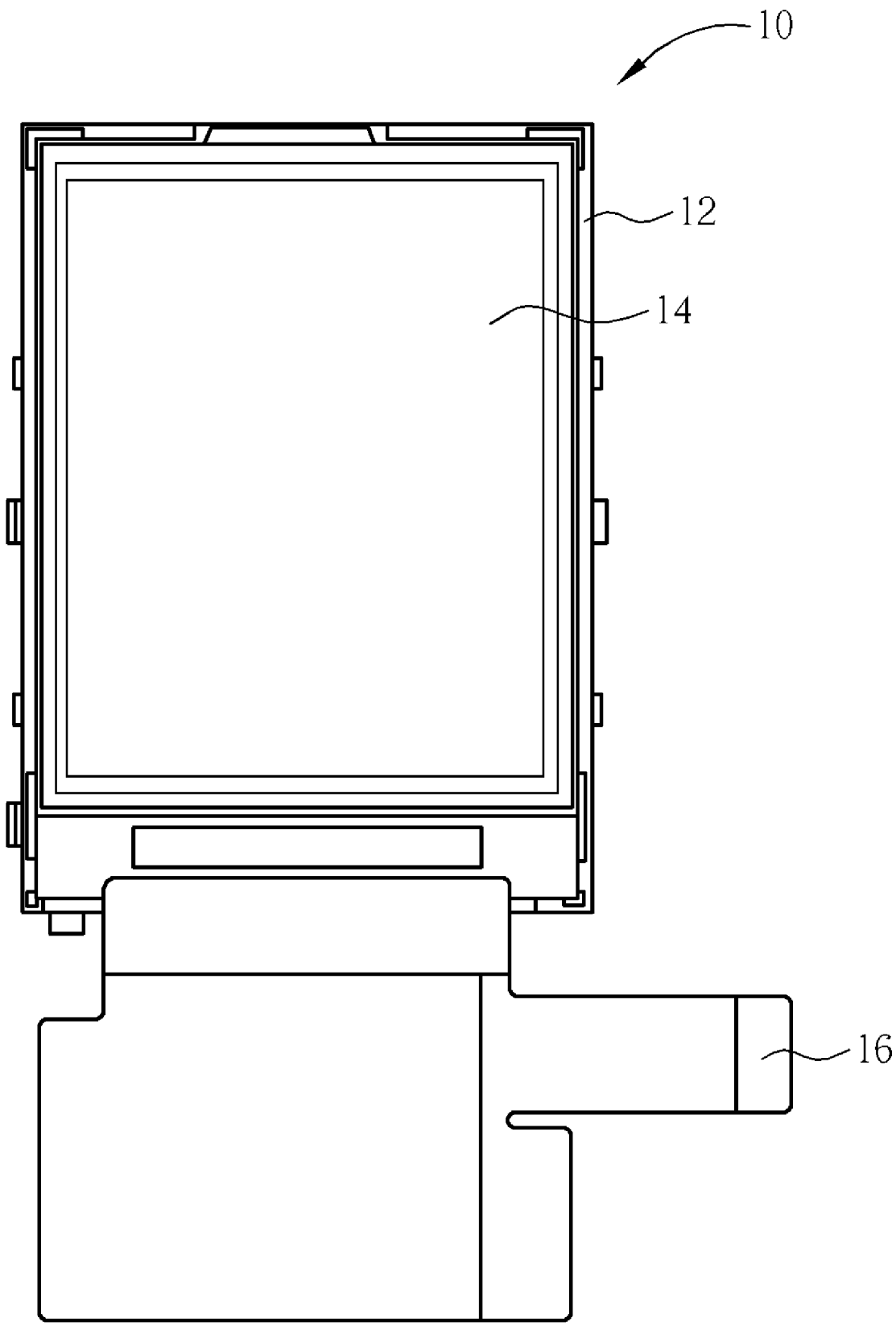
FIG. 1 is a schematic front view of a prior art flat display module.
Figure 2:
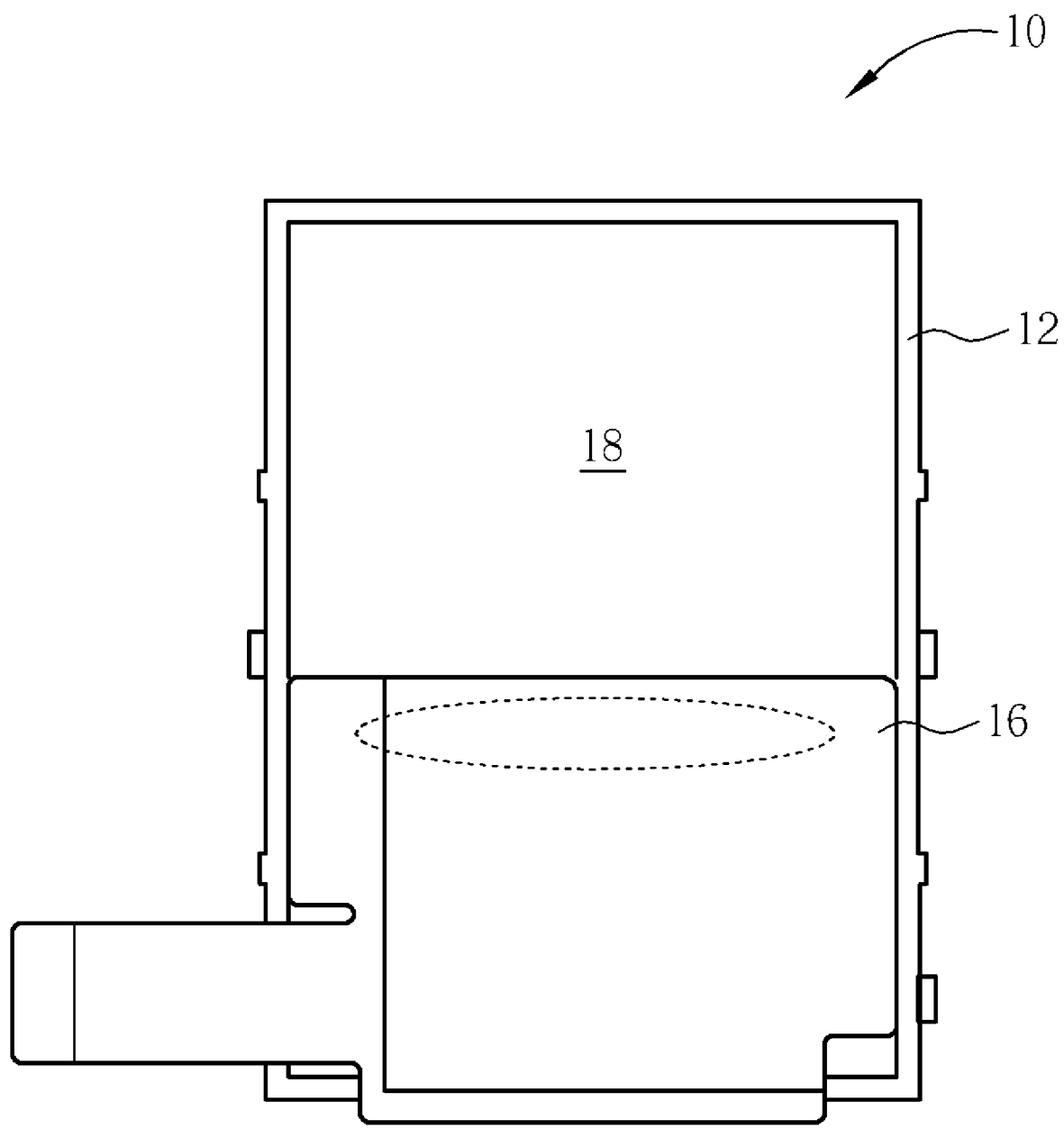
FIG. 2 is a schematic back view of the prior art flat display module of FIG. 1.
Figure 3:
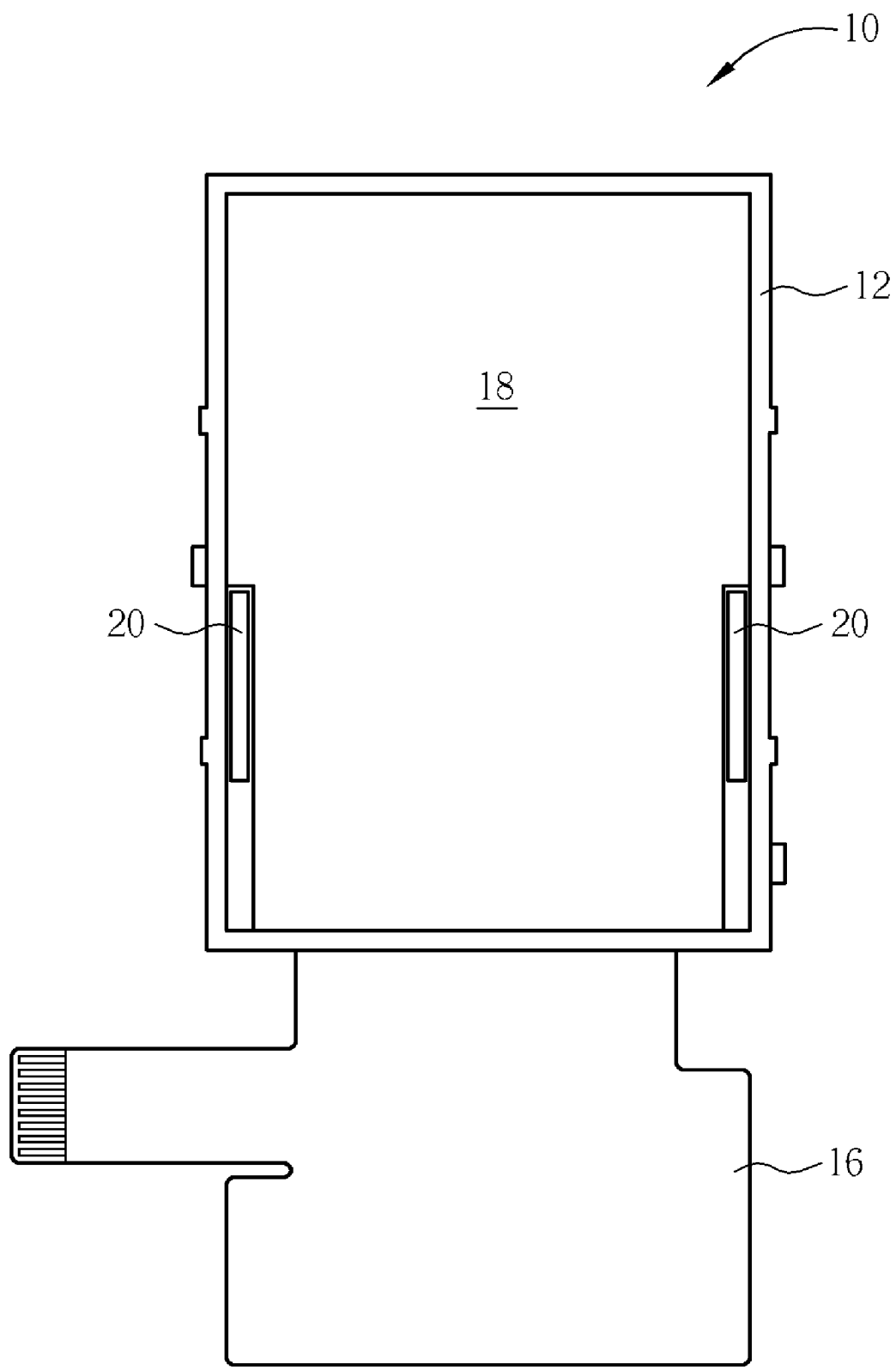
FIG. 3 is a schematic back view of a prior art flat display module.
Figure 4:
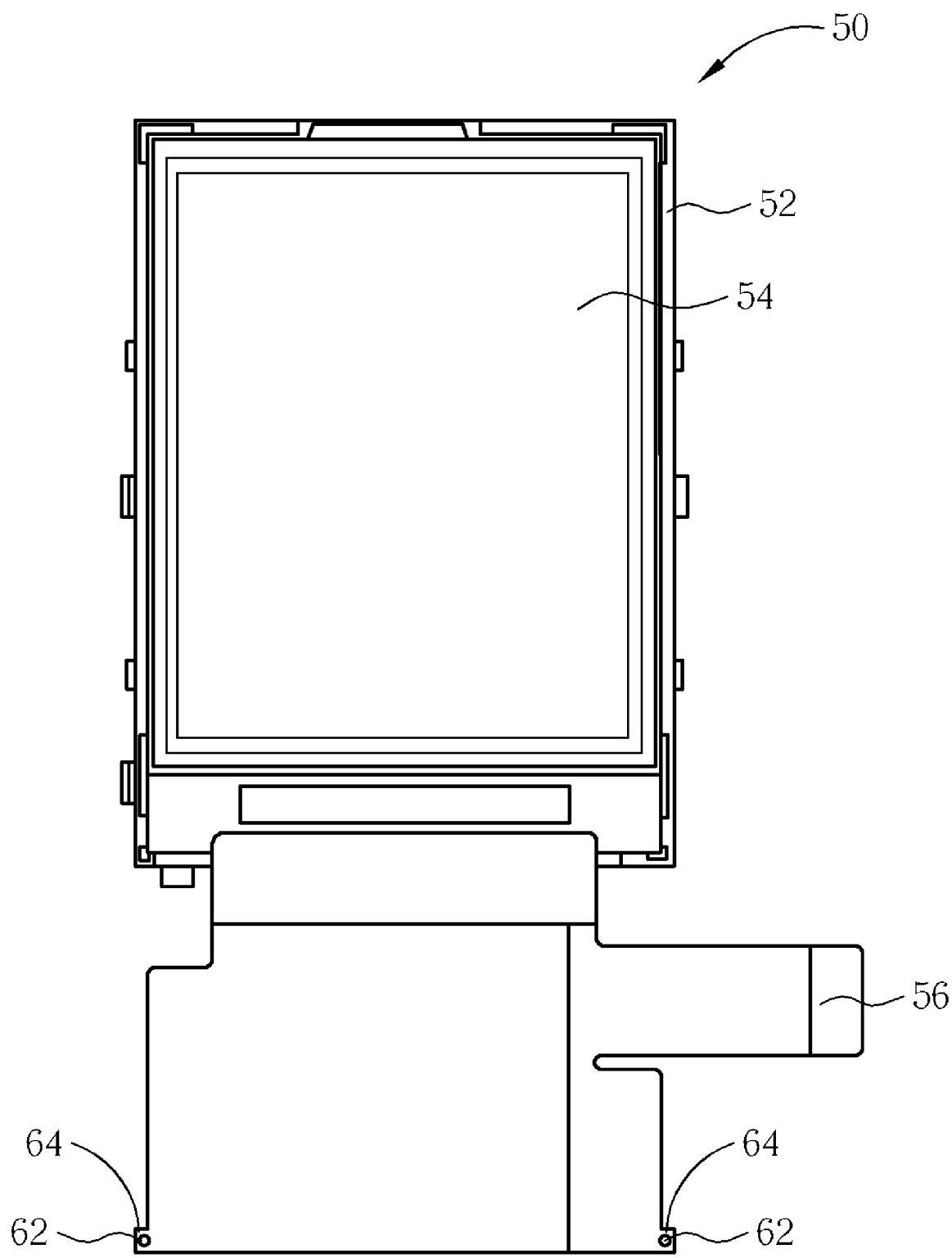
FIG. 4 is a schematic front view of a flat display module according to the first embodiment of the present invention.
Figure 5:
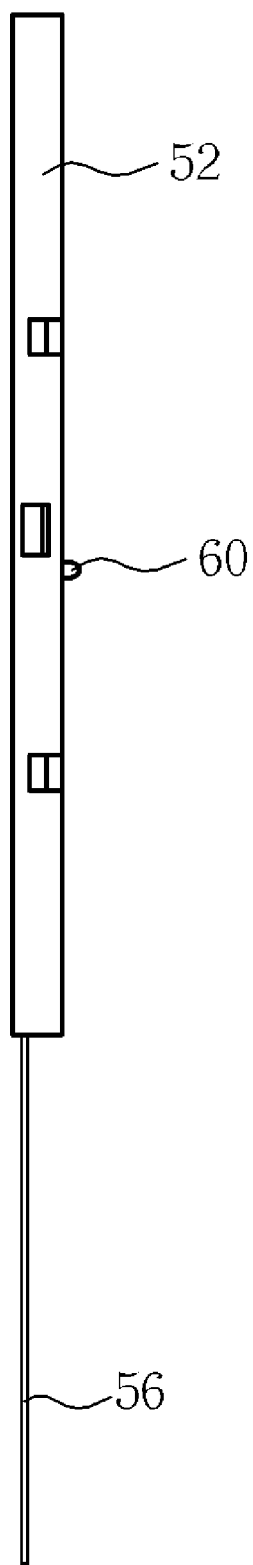
FIG. 5 is a schematic side view of the flat display module of FIG. 4.
Figure 6:
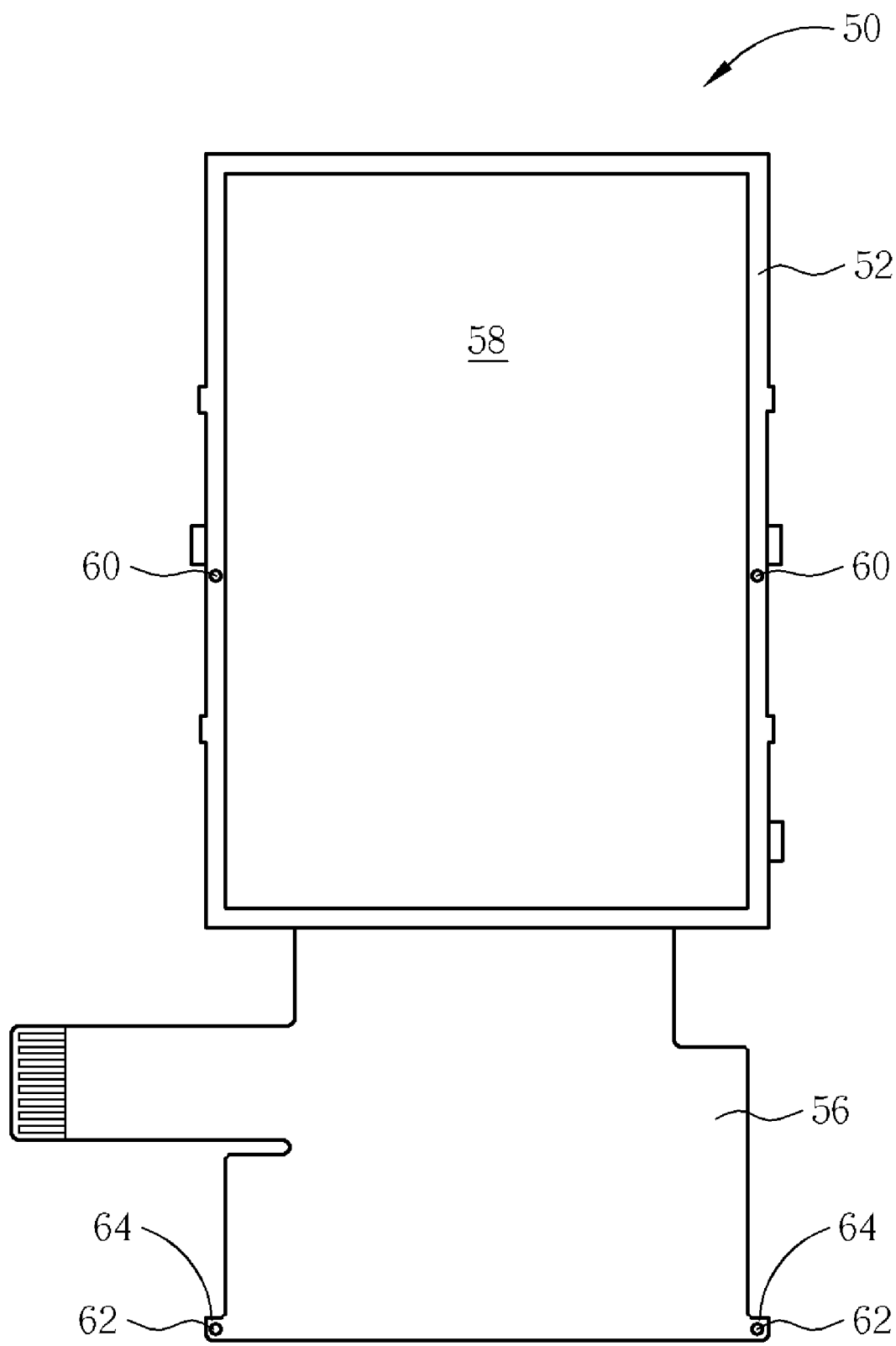
FIG. 6 is a schematic back view of the flat display module of FIG. 4.

FIG. 4 to FIG. 8 are schematic diagrams according to the first preferred embodiment of the present invention. Please refer to FIG. 4 to FIG. 6. FIG. 4 is a schematic front view of a flat display module 50 according to the first preferred embodiment of the present invention, FIG. 5 is a schematic side view of the flat display module 50 of FIG. 4, and FIG. 6 is a schematic back view of the flat display module 50 of FIG. 4. The flat display module 50 of the present invention is applied to a mobile phone, and it comprises a housing 52, a flat display panel 54, an FPC 56 connected to the flat display panel 54, and a backlight module. The housing 52 is made from plastic and comprises a compartment for holding the backlight module and the flat display panel 54 thereof. In addition, the housing 52 comprises two fixing pins 60 positioned on two opposite edges at the back thereof. Because it is better for the fixing pins 60 and the housing 52 to be integrally formed, the fixing pins 60 are also made from plastic. In order to reduce the size of the flat display module 50, the edge of the housing 52 is very thin and the diameters of the fixing pins 60 are preferably smaller than about 2 mm. The FPC 56 comprises two sections 64 positioned on two opposite edges of the bottom. Each section 64 comprises a fixing hole 62 with a size slightly larger than the size of the fixing pin 60. The flat display panel 54 is preferably a liquid crystal display panel, and the backlight module comprises at least a light source, a plurality of optical films, and a reflector 58. The reflector 58 is seen on the reverse side of the flat display module 50.

As a result, the present invention provides a method for fixing an FPC 56. The method includes providing a housing 50 having at least a fixing pin 60 on the reverse side thereof; providing a display panel 54 and an FPC 56 connected to the display panel, the FPC 56 comprising at least a fixing hole 62; and folding back the FPC 56 on the reverse side of the housing such that the fixing hole 62 corresponds to the fixing pin 60.

Figure 7:
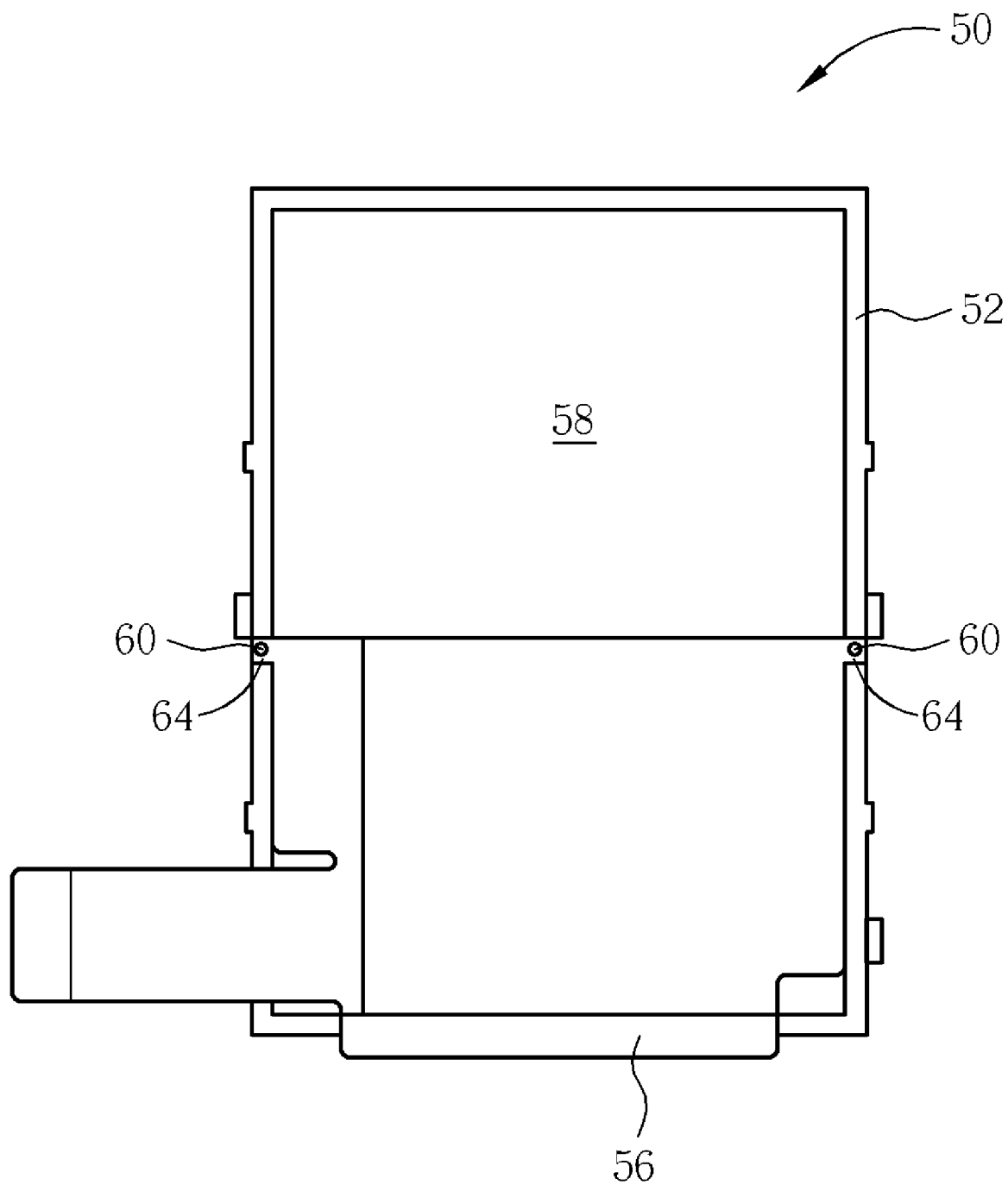
FIG. 7 is a schematic diagram illustrating a method for fixing an FPC of FIG. 4 according to the present invention.
Figure 8:
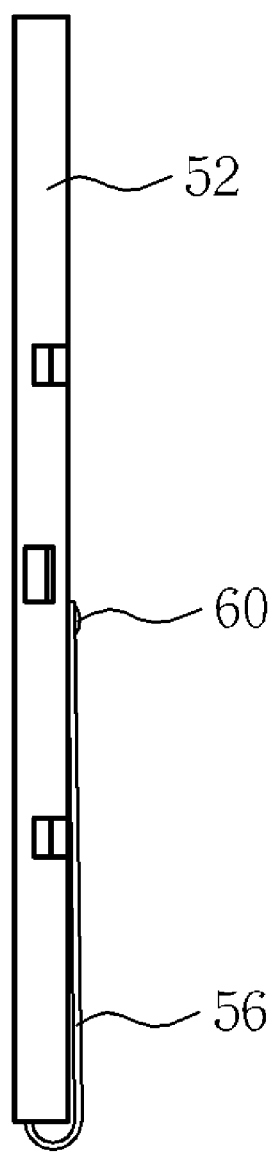
FIG. 8 is a schematic side view of the flat display module of FIG. 7.

Please refer to FIG. 7 and FIG. 8. FIG. 7 is a schematic diagram illustrating a method for fixing an FPC 56 of FIG. 4 according to the present invention, and FIG. 8 is a schematic side view of the flat display module 50 of FIG. 7. The FPC 56 is folded back and nearly parallel to the reflector 58 such that each fixing pin 60 passes through a fixing hole 62. A hot mounting process is performed to the fixing pins 60 to enlarge the top ends of the fixing pins 60 until the top ends of the fixing pins 60 are larger than the fixing holes 62 and the fixing pins 60 press or hold the FPC 56 onto the housing 52. The above-mentioned hot mounting process is performed by a hot mounting device or a smoothing iron, and the shape of the plastic fixing pins 60 is changed by heating to 70-80° C. As shown in FIG. 8, because of the hot mounting, the top ends of the fixing pins 60 are flattened and become larger than the size of the fixing holes 62 so that the fixing pins 60 press the FPC 56 onto the housing 52. It deserves to be mentioned that, while the FPC 56 is pressed onto the housing 52, the FPC 56 covers the surface of the reflector 58, but only the sections 64 of the FPC 56 cover the edge of the housing 52.

Figure 9:
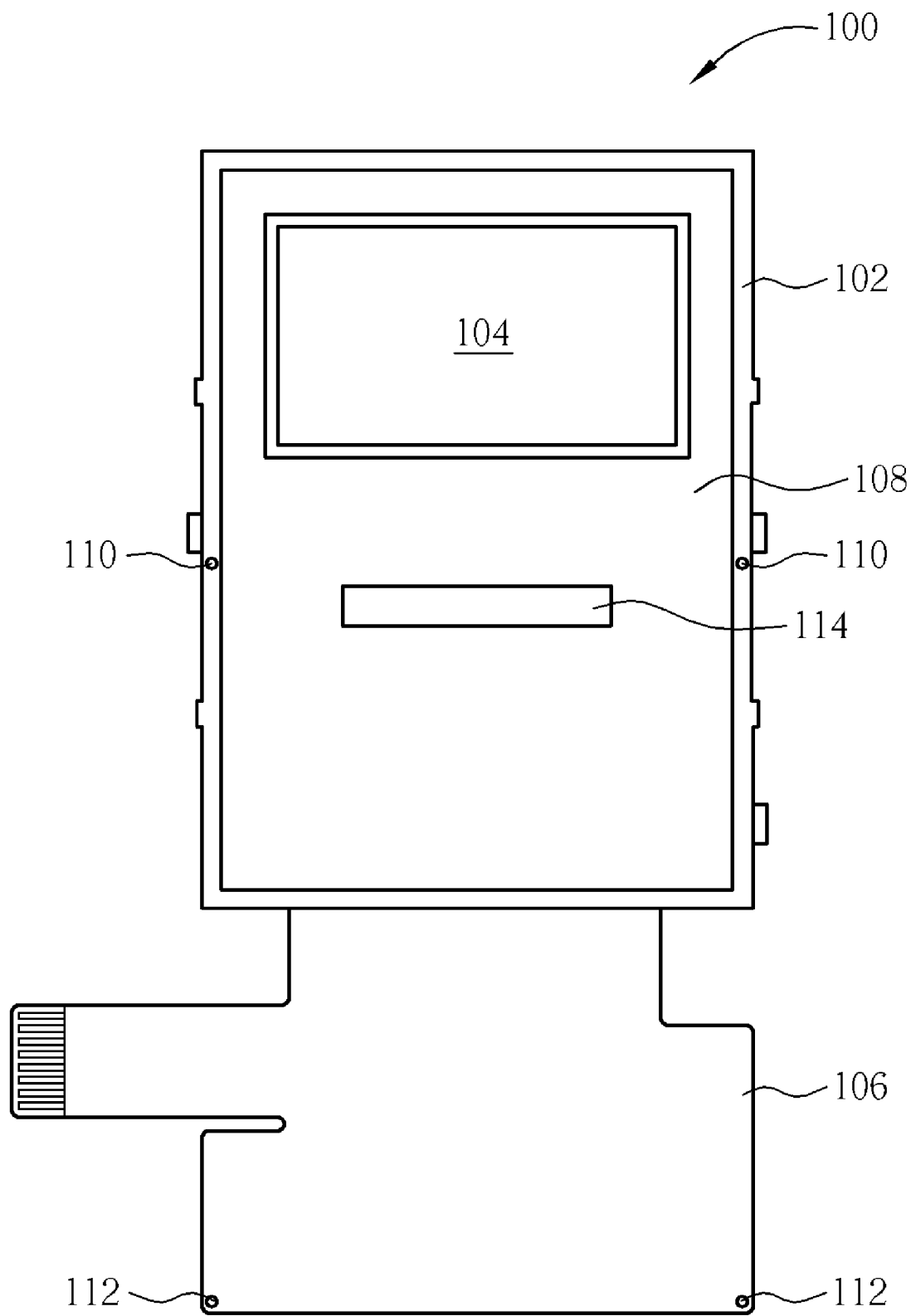
FIG. 9 and FIG. 10 are schematic diagrams according to the second embodiment of the present invention.
Figure 10:
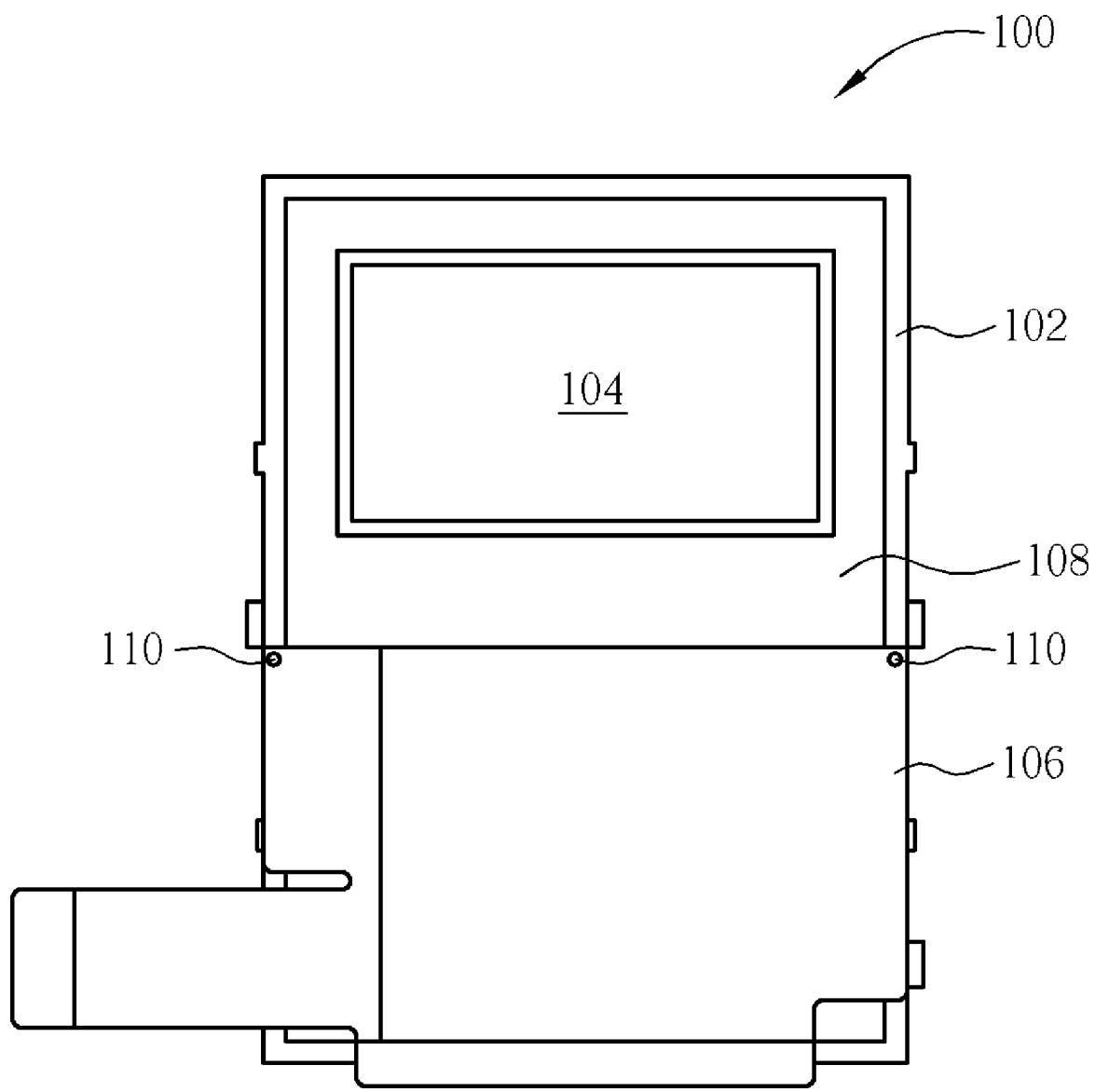

Please refer to FIG. 9 and FIG. 10. FIG. 9 and FIG. 10 are schematic diagrams according to the second preferred embodiment of the present invention. FIG. 9 is a schematic diagram illustrating the reverse side of a flat display module 100 according to the second preferred embodiment of the present invention. According to the method of the present invention, a housing 102 is provided. The housing 102 comprises two fixing pins 110 protrudent from the housing 102 and a fixing plane 108, wherein the fixing pins 110 are positioned on two opposite edges of the back of the housing 102. The fixing plane 108 and the edge of the housing 102 form a compartment for holding a display panel. Subsequently, a backlight module (not shown in the figure), a display panel (not shown in the figure), a FPC 106 connected to the display panel, and a sub-display panel 104 are provided. The FPC 106 comprises two fixing holes 104 positioned on two opposite edges in the bottom, and the fixing holes 104 correspond to the fixing pins 110. The display panel and the FPC 106 are positioned in the compartment of the housing 102, and the sub-display panel 104 is positioned on the reverse side of the flat display module 100. Thereafter, conductive glue 114 made from metal is disposed on the surface of the fixing plane 108, and the FPC 106 is folded back onto the surface of the fixing plane 108 such that the fixing pins 110 pass through the fixing holes 112.

Furthermore, a hot mounting process is performed to the fixing pins 110 to flatten the top ends of the fixing pins 110 so that the fixing pins 110 press the FPC 106 onto the surface of the fixing plane 108. At this time, the conductive glue 114 contacts the FPC 106 and enhances the fixity for the FPC 106. It is an advantage that the conductive glue 114 can reduce electromagnetic interference by its electric conductivity so as to improve the quality of communication. According to the second preferred embodiment of the present invention, the width of the FPC 106 approximately equals the width of the housing 102. As a result, the FPC 106 covers the surface of the fixing plane 108 and the edge of the housing 102 while the FPC 106 is folded back onto the reverse side of the flat display module 100. Different from the first preferred embodiment, the fixing holes 110 are positioned on two opposite edges of the FPC 106 instead of comprising two sections 64 for placing the fixing holes 62 in the FPC 56.

Figure 11:
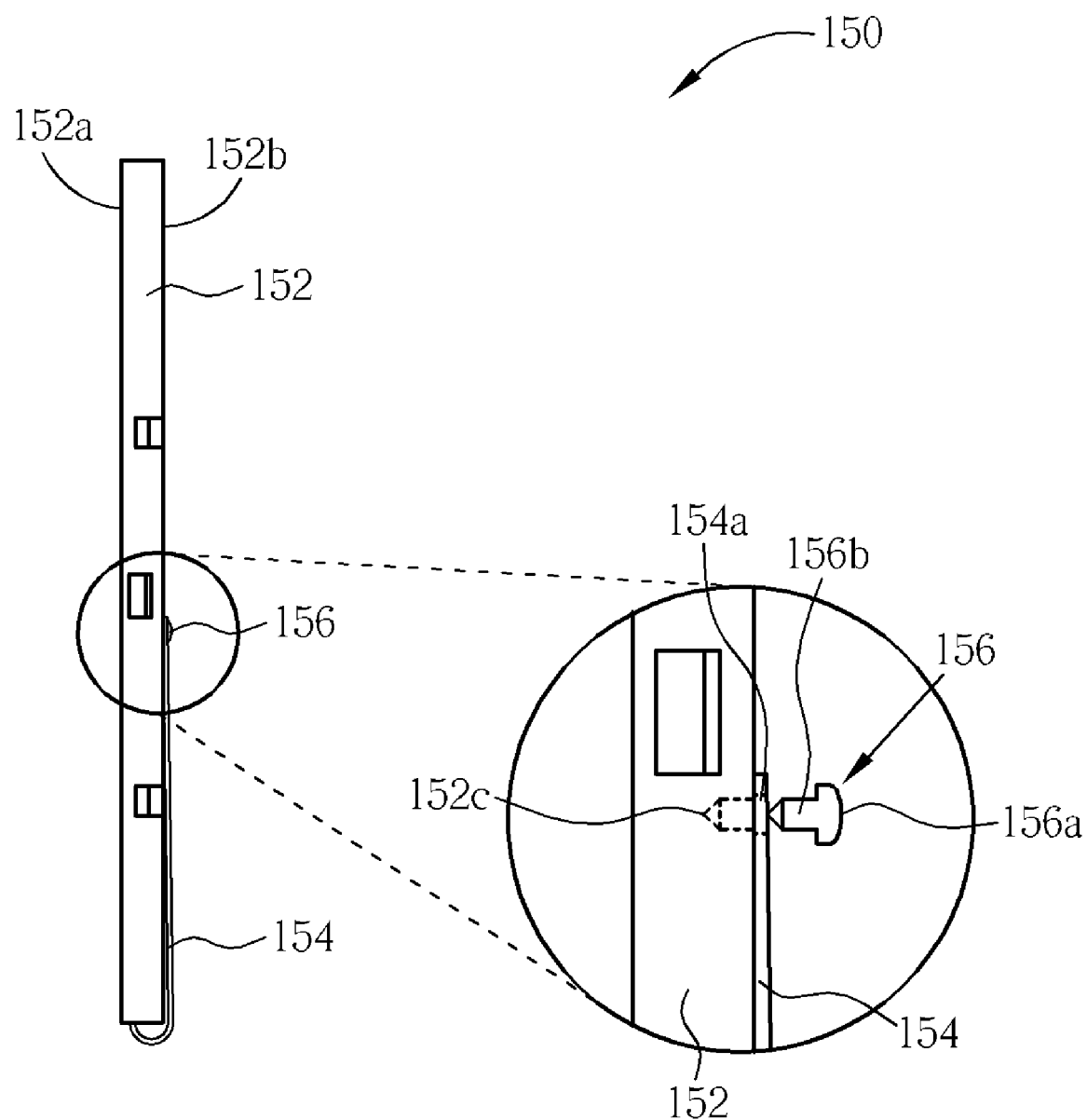
FIG. 11 is a schematic side view of a flat display module according to the third embodiment of the present invention.

However, the fixing component is not limited to the fixing pins disclosed in the first and second preferred embodiments. In the third preferred embodiment of the present invention, the FPC is fixed by at least a fixing component separated from the housing. Please refer to FIG. 11. FIG. 11 is a schematic side view of a flat display module 150 according to the third preferred embodiment of the present invention. As mentioned above, the flat display module 150 of the present invention comprises a housing 152, a display panel (not shown in the figure) positioned on the first surface 152a of the housing 152, an FPC 154 connected to the display panel and folded back on the second surface 152b of the housing 152, and at least a fixing component 156 passing through at least a fixing hole 154a of the FPC 154 and fixed on the housing 152. The magnified portion of FIG. 11 illustrates the relative positions of the fixing component 156, the fixing hole 154a, and the housing 152. The fixing component 156 comprises a cap 156a and a rod 156b. The size of the rod 156b is a little smaller than the size of the fixing hole 154a, and the size of the cap 156a is a little larger than the size of the fixing hole 154a so that the fixing component 156 acts as a fixing plug. As a result, the second surface 152b of the housing 152 comprises at least a fixing recess 152c corresponding to the fixing hole 154a and the fixing component 156 in order to hold the rod 156b of the fixing component 156.

Thus, the method of the present invention for fixing an FPC 154 is shown as follows. Above all, the display panel is fixed on the first surface 152a of the housing 152 and the FPC 154 is folded back on a second surface 152b of the housing 152 so that the fixing hole 154a of the FPC 154 corresponds to the fixing recess 152c. Subsequently, the rod 156b of the fixing component 156 passes through the fixing hole 154a and is fixed in the fixing recess 152c. Furthermore, the fixing component 156 can be made from plastic so that the fixing component 156 and the plastic housing 152 can be combined by a heat melting process, and the fixing component 156 can be fixed due to the combination.

Figure 12:
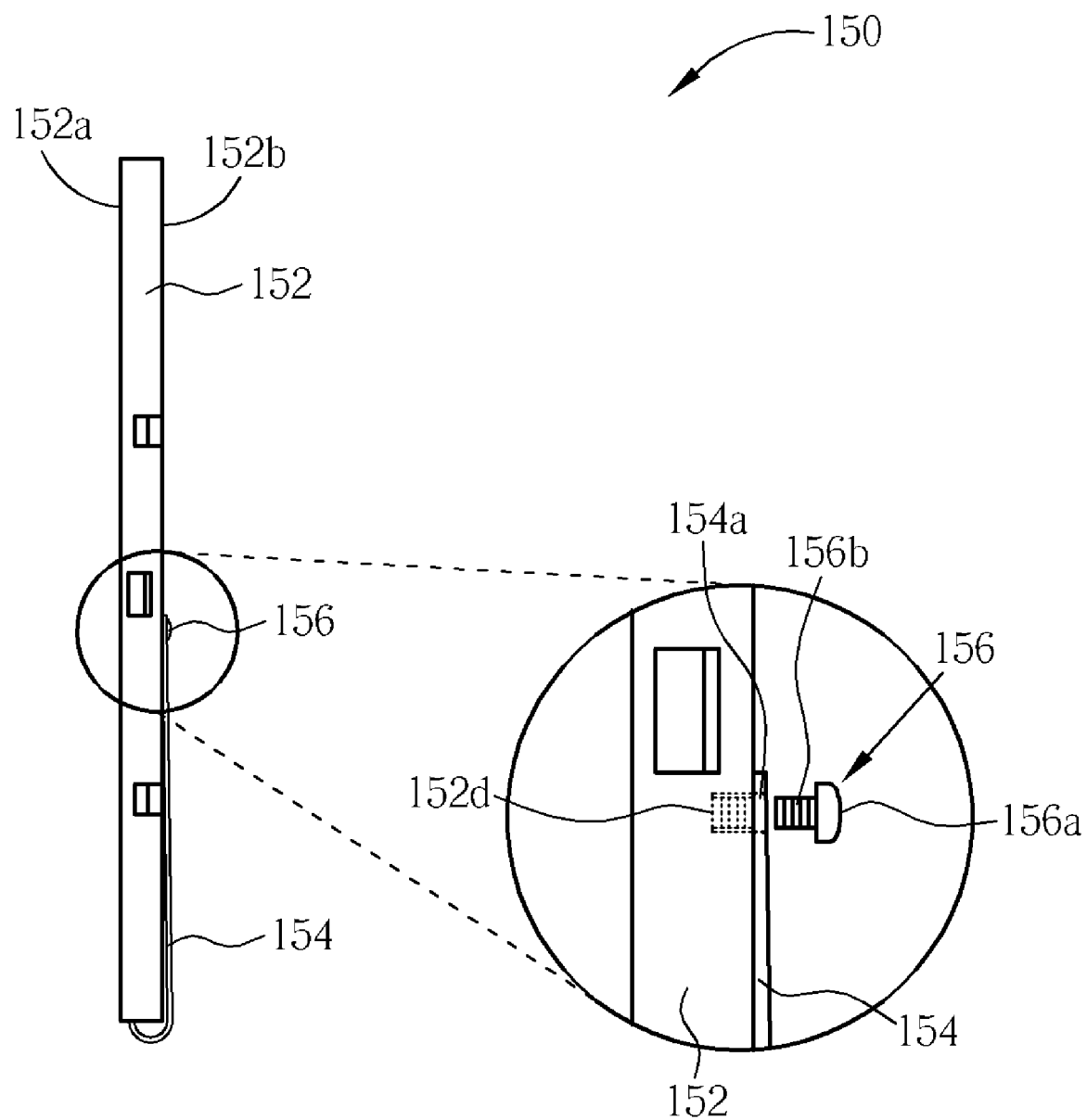
FIG. 12 is a schematic side view of a flat display module according to the fourth preferred embodiment of the present invention.

It deserves to be mentioned that FIG. 11 does not limit the fixing component 156. The fixing component 156 can be a screw or any other component that can be used as a fixing plug. FIG. 12 is a schematic diagram according to the fourth preferred embodiment of the present invention. The fixing component 156 is a screw in this preferred embodiment. The second surface 152*b* of the housing 152 further comprises an anchor component 152*d* therein to fix the screw-like fixing component 156 onto the housing 152. The anchor component 152*d* can be a tube with a screw thread such as a copper tube with a screw thread. In addition, the fixing component 156 can be a self-drilling screw that can be screwed into the housing 152 directly. A self-drilling screw can fix the FPC 154 without a fixing recess 152*c* or an anchor component 152*d* in the housing 152.

The above-mentioned embodiments reference flat display modules of mobile phones as examples, however, the method of the present invention is not limited to only flat display modules of mobile phones. The method of the present invention can be applied to products needing better component placement within limited space or small electronic products such as notebook computers, personal digital assistants (PDA), etc. In addition, the amount of the fixing pins on the housing and the amount of the fixing holes on the FPC are not limited to the amounts disclosed in the embodiments. A person skilled in this art can change the amounts, the materials, and the positions of the fixing pins and the fixing holes according to designs of specific products.

Compared to the prior art, the method of the present invention fixes the FPC onto the surface of the flat display module by setting the fixing pin and performing a hot mounting process. Because of the extremely small size of the fixing pin, the method of the present invention can use a small area, such as the edge of the housing, to effectively fix the FPC. Furthermore, the method of the present invention can be applied to flat display modules of various sizes without changing the sizes and shapes of the reflectors.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fixing a flexible printed circuit (FPC) of a display, the method comprising:

providing a housing comprising at least a separable fixing component that comprises a rod and a cap connected to each other;

providing a display panel and an FPC connected to the display panel, the FPC comprising at least a fixing hole;

disposing the display panel on a first surface of the housing and folding back the FPC on a second surface of the housing; and detachably fixing the rod through the fixing hole to the second surface of the housing so that the cap presses the FPC onto the second surface of the housing;

wherein the fixing component is made from plastic material, and the method further comprises performing a heat melting process to combine the fixing component and the housing after the fixing of the rod through the fixing hole, such that the FPC is pressed onto the second surface of the housing.

2. The method of claim 1, wherein a size of the rod is less than that of the fixing hole, and a size of the cap is greater than that of the fixing hole.

3. The method of claim 1, wherein the housing is made from plastic.

4. The method of claim 1, wherein the fixing component is a fixing plug.

5. The method of claim 1, wherein the second surface of the housing comprises at least one fixing recess corresponding to the fixing hole and the fixing component.

6. The method of claim 5, wherein the fixing component passing through the fixing hole is fixed in the fixing recess, when fixing the rod through the fixing hole to the second surface of the housing.

7. The method of claim 1, wherein the fixing component is a screw.

8. The method of claim 7, wherein the second surface of the housing comprises an anchor component fixing the fixing component onto the housing.

9. The method of claim 8, wherein the anchor component is a tube with a screw thread.

* * * * *